US008519740B2

(12) United States Patent
Hutton et al.

(10) Patent No.: US 8,519,740 B2
(45) Date of Patent: Aug. 27, 2013

(54) INTEGRATED CIRCUITS WITH SHARED INTERCONNECT BUSES

(75) Inventors: Michael D. Hutton, Mountain View, CA (US); David Lewis, Toronto (CA)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 13/345,564

(22) Filed: Jan. 6, 2012

(65) Prior Publication Data
US 2013/0176052 A1 Jul. 11, 2013

(51) Int. Cl.
*H03K 19/173* (2006.01)
(52) U.S. Cl.
USPC .................... 326/38; 326/41; 326/47
(58) Field of Classification Search
USPC ................................ 326/37–41, 47
See application file for complete search history.

(56) References Cited

U.S. PATENT DOCUMENTS

| 5,359,536 | A | 10/1994 | Agrawal et al. |
| 5,621,650 | A | 4/1997 | Agrawal et al. |
| 5,726,584 | A | 3/1998 | Freidin |
| 6,590,415 | B2* | 7/2003 | Agrawal et al. ............. 326/38 |
| 6,747,480 | B1 | 6/2004 | Kaptanoglu et al. |
| 6,897,679 | B2 | 5/2005 | Cliff et al. |
| 7,330,052 | B2 | 2/2008 | Kaptanoglu et al. |
| 2006/0174050 | A1 | 8/2006 | Chadha et al. |

OTHER PUBLICATIONS

"Fracturable FPGA Logic Elements," Hutton et al., May 1, 2006 [retrieved on Nov. 3, 2011]. Retrieved from the Internet <URL:http://www.altera.com/literature/cp/cp-01006.pdf>.
"Area-Efficient FPGA Logic Elements: Architecture and Synthesis," Anderson et al., [retrieved on Nov. 3, 2011]. Retrieved from the Internet <URL:http://www.eecg.toronto.edu/~janders/aspdac_2011.pdf>.

* cited by examiner

*Primary Examiner* — Jany Richardson
(74) *Attorney, Agent, or Firm* — Treyz Law Group; Chih-Yun Wu

(57) ABSTRACT

An integrated circuit may include programmable logic regions coupled in parallel to an interconnect bus. Multiplexing circuitry may be interposed between the programmable logic regions and the interconnect bus. The multiplexing circuitry may be formed from multiplexing circuits formed in a cascade structure. The multiplexing circuitry may dynamically receive control signals that determines which programmable logic region is allowed to drive output signals onto the interconnect bus. Alternatively, each programmable logic region may have an associated output circuit that is coupled to the interconnect bus. The output circuits may be dynamically controlled by control circuitry. The output circuits may receive control signals from the control circuitry that selectively enable and selectively disable the output circuits. The output circuits may be formed with logic circuitry that ensures that the interconnect bus is not simultaneously driven by the output circuits.

19 Claims, 15 Drawing Sheets

INTEGRATED CIRCUITS WITH SHARED INTERCONNECT BUSES

BACKGROUND

This relates to integrated circuits such as programmable integrated circuits with interconnect circuitry.

Programmable integrated circuits are well known. Programmable integrated circuits can be programmed by a user to implement a desired custom logic function. In a typical scenario, a logic designer uses computer-aided design (CAD) tools to design a custom logic circuit. When the design process is complete, the tools generate configuration data. The configuration data is loaded into programmable integrated circuit memory elements to configure the devices to perform the functions of the custom logic circuit. In particular, the configuration data configures programmable interconnects, programmable routing circuits, and programmable logic circuits in the programmable integrated circuits. During normal operation, the programmable integrated circuit memory elements provide static control signals that configure the programmable logic regions and programmable interconnects to perform the desired custom logic function.

Programmable integrated circuits include programmable logic circuits that are configured to receive input signals and perform custom functions to produce output signals. The input and output signals to each logic circuit are provided by interconnects that can be configured to selectively route signals throughout the programmable integrated circuit. Programmable integrated circuits are often programmed to perform custom user functions that produce outputs based on multiple different inputs. For example, logic circuits may be programmed to perform multiplexing functions to select a given input from multiple inputs. Each input often includes many different signals (e.g., each of the inputs may include eight, sixteen, or more data bits at any given time).

Programmable integrated circuits use interconnects to route data to the inputs of the logic circuits. The interconnects are statically configured (e.g., by loading configuration values into associated programmable memory elements) to route the data to the logic circuits. However, this may result in inefficient use of the interconnects in scenarios such as when the logic circuits only require a subset of the inputs at any given time (e.g., when the logic circuits are programmed to perform a multiplexing function that selects only one of the inputs at any given time). In these scenarios, the interconnects that provide non-selected inputs may be unused (e.g., due to the static configuration of the interconnects).

SUMMARY

An integrated circuit may include programmable logic regions that can be configured to perform custom user functions. The programmable logic regions may be coupled in parallel to an interconnect bus. Multiplexing circuitry may be interposed between the programmable logic regions and the interconnect bus. The multiplexing circuitry may be formed from multiplexing circuits formed in a cascade structure. The multiplexing circuitry may dynamically receive control signals in real time from control circuitry that controls which programmable logic region is allowed to drive output signals onto the interconnect bus.

In an alternate embodiment, each programmable logic region may have an associated output circuit that is coupled to the interconnect bus. The output circuits may be dynamically controlled by control circuitry such as storage and processing circuitry or programmable logic regions that have been configured to perform control functions. The output circuits may receive control signals (e.g., from control circuitry) that selectively enable and selectively disable the output circuits. For example, the output circuits may be formed from tristate drivers that are controlled by the control signals. The output circuits may be controlled to share the interconnect bus by only enabling a selected one of the output circuits at a time. The selected output circuit may be enabled so that output signals from a programmable logic region that is associated with the selected output circuit are driven onto the interconnect bus while output circuits that are associated with other programmable logic regions are disconnected from the interconnect bus.

The integrated circuit may be formed with bi-directional driver circuitry that drive signals in first and second directions along the interconnect bus. The bi-directional driver circuitry may drive signals along the interconnect bus based on the control signals that are provided to the output circuits. The output circuits may be formed with logic circuitry that monitors the bi-directional driver circuitry and ensures that the interconnect bus is not simultaneously driven by the output circuits. For example, the logic circuitry may modify control signals that are provided to the bi-directional driver circuitry so that only one output circuit drives the interconnect bus at any given time.

Further features of the invention, its nature and various advantages will be more apparent from the accompanying drawings and the following detailed description of the preferred embodiments.

DETAILED DESCRIPTION

The present invention relates to programmable integrated circuits. The programmable integrated circuits may include programmable logic, programmable interconnects, and programmable routing circuitry.

Figure 1:
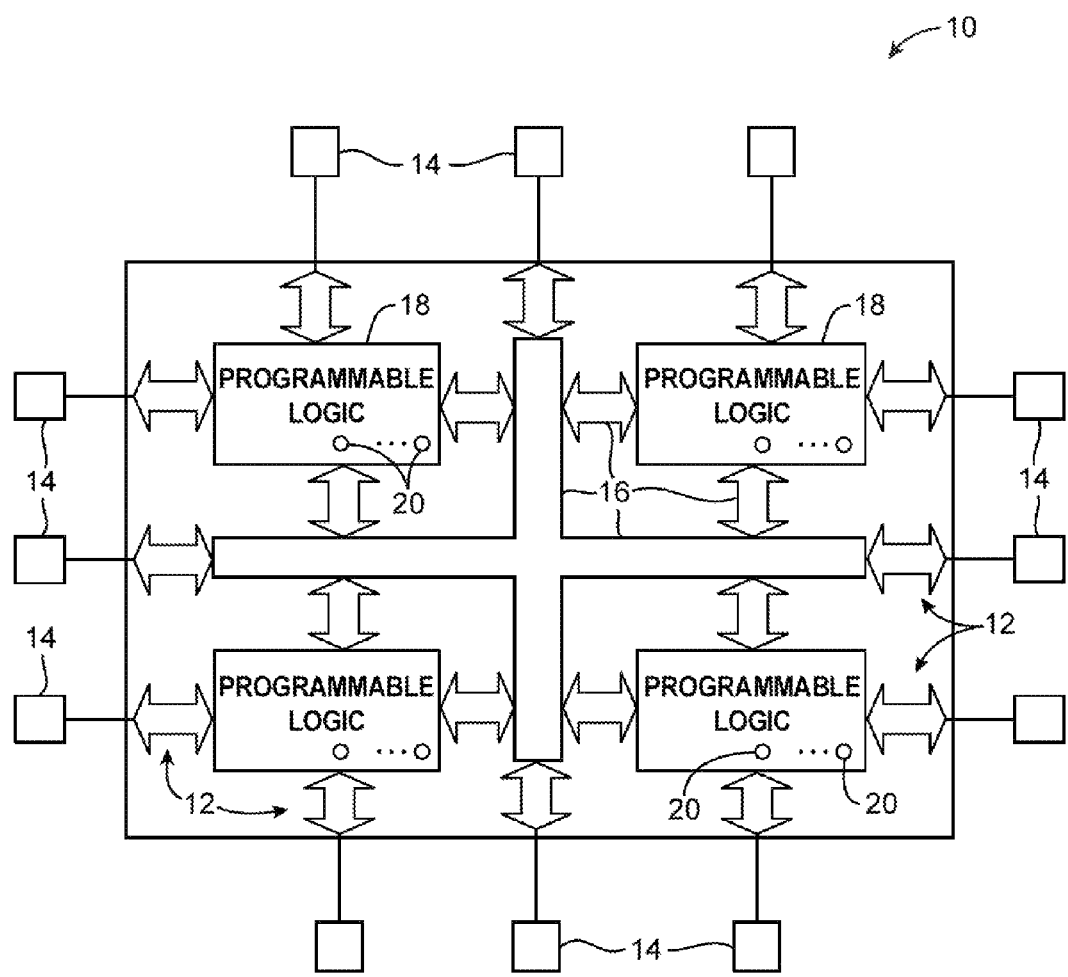
FIG. 1 is an illustrative diagram of a programmable integrated circuit with programmable logic regions in accordance with an embodiment of the present invention.

FIG. 1 shows a diagram of an illustrative programmable integrated circuit device. As shown in FIG. 1, device 10 may have input-output (I/O) circuitry 12 for driving signals off of device 10 and for receiving signals from other devices via input-output pins 14.

Interconnection resources 16 such as global and local vertical and horizontal conductive lines and buses may be used to route signals throughout device 10. Interconnection resources 16 include fixed interconnects (e.g., conductive paths) and programmable interconnects (i.e., programmable connections between respective fixed interconnects). Interconnection resources 16 may sometimes be referred to herein as interconnects (e.g., interconnects formed from combinations of fixed interconnects and programmable interconnects).

Interconnects 16 may be used to interconnect regions of programmable logic such as programmable logic regions 18. Programmable logic regions 18 may sometimes be referred to as logic array blocks or programmable circuit regions. Programmable logic regions 18, may, if desired, contain groups of smaller logic regions. These smaller logic regions, which may sometimes be referred to as logic elements or adaptive logic modules, may be interconnected using local interconnection resources (e.g., routing paths and/or routing circuitry within programmable logic regions 18).

Programmable logic regions 18 may include combinational and sequential logic circuitry. For example, programmable logic regions 18 may include look-up tables, registers, and multiplexers. Programmable logic regions 18 may be configured to perform a custom logic function.

Programmable logic regions 18 contain programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable elements 20 may be used to provide static control output signals for controlling the state of logic components in programmable logic 18. The output signals generated by elements 20 are typically applied to gates of metal-oxide-semiconductor (MOS) transistors (sometimes referred to as pass gate transistors).

The circuitry of device 10 may be organized using any suitable architecture. As an example, logic regions 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 1A:
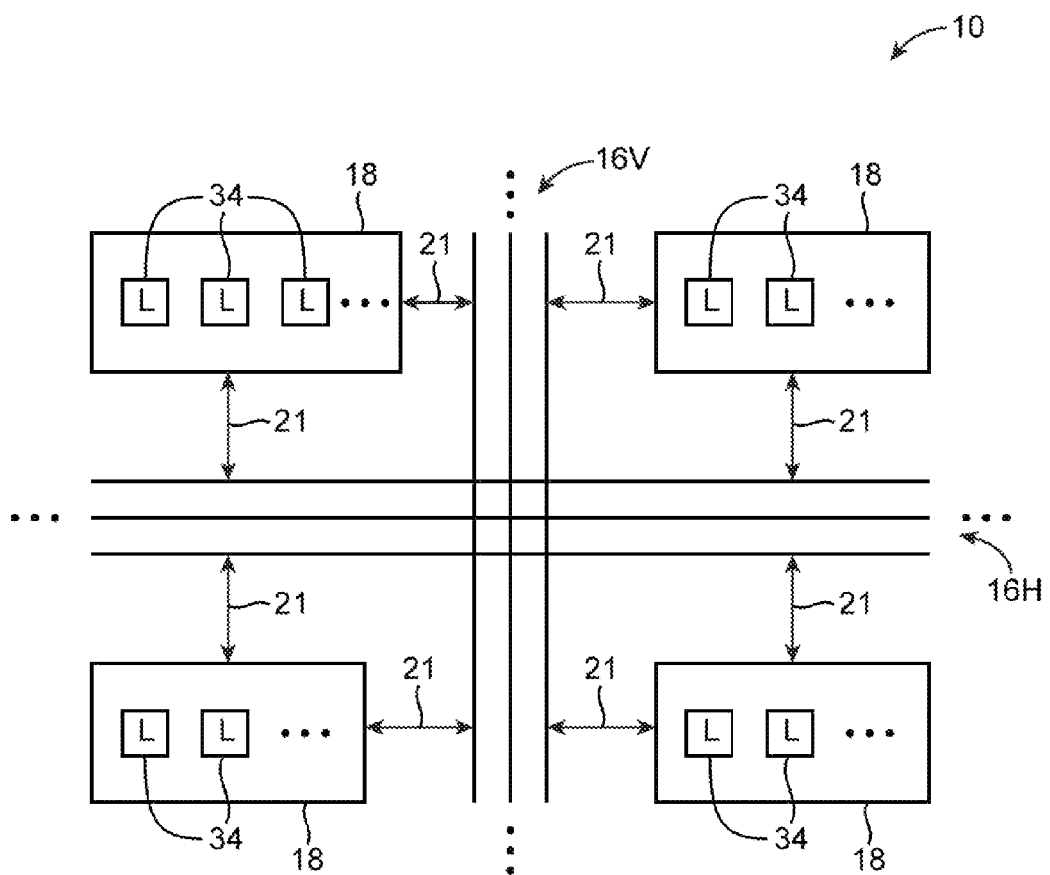
FIG. 1A is an illustrative diagram of programmable logic regions with input-output circuitry configurable to selectively drive interconnects in accordance with an embodiment of the present invention.

FIG. 1A is a diagram of programmable logic regions 18 in device 10 that may include input-output circuits 21 configurable to drive horizontal interconnects 16H (e.g., interconnects formed along a horizontal axis of device 10) and vertical interconnects 16V (e.g., interconnects formed along a vertical axis of device 10). Programmable logic regions 18 may include sub-regions 34 (e.g., logic elements or adaptive logic modules) that receive input signals from interconnects 16V and 16H via input-output circuits 21 and perform custom functions on the input signals to produce output signals. The output signals produced by logic regions 34 may be provided to output circuits of input-output circuits 21. The output circuits may drive the output signals onto selected interconnects (e.g., the output circuits may be configured to drive some, all, or none of the output signals onto the selected interconnects). Input-output circuits 21 may have associated control circuitry that may be configured to select which output signals are provided to the selected interconnects.

Figure 2:
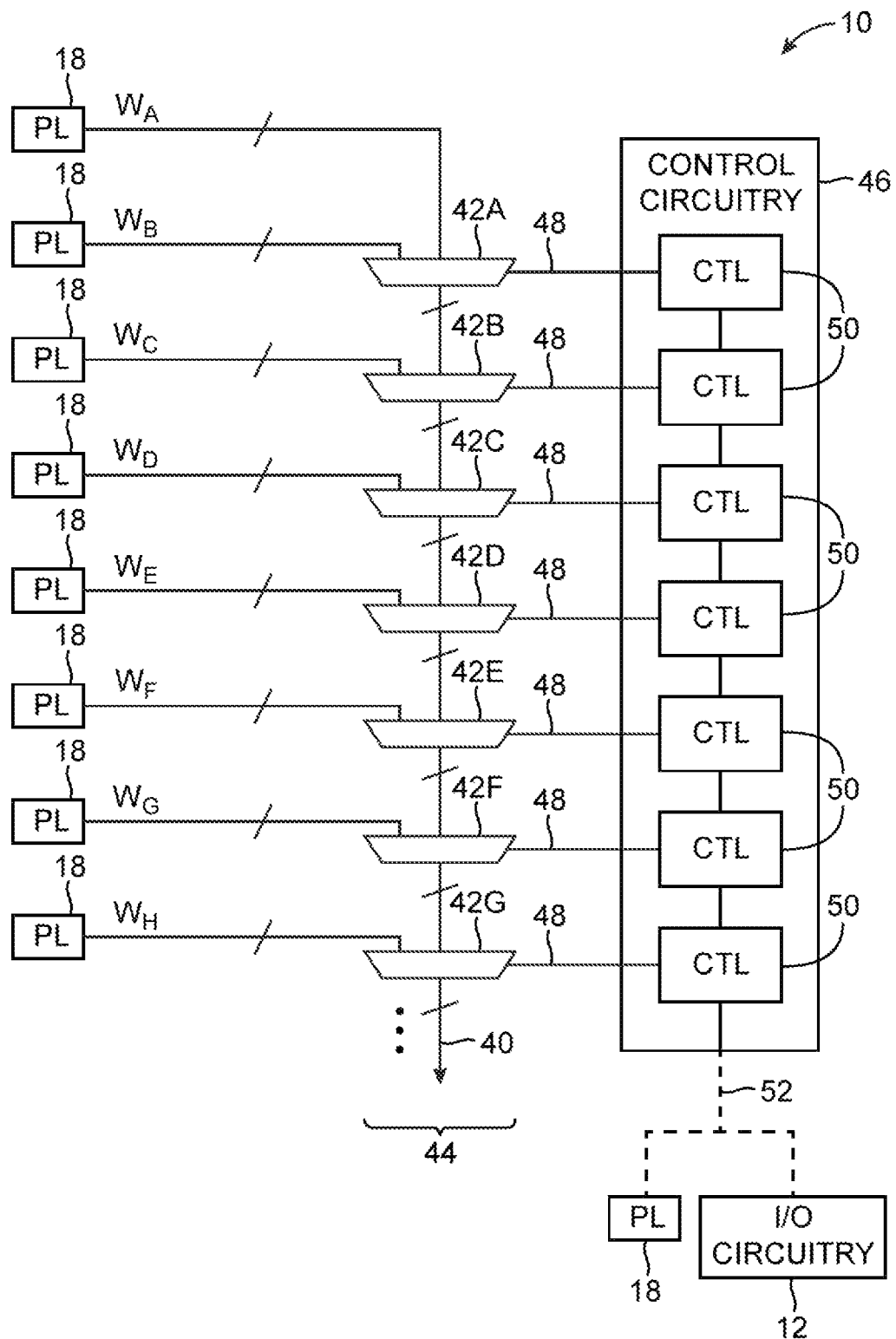
FIG. 2 is an illustrative diagram of interconnect circuitry that may be used by multiple programmable logic regions to share an interconnect bus in accordance with an embodiment of the present invention.

Interconnects may occupy a disproportionate amount of area on device 10 relative to functional logic (e.g., relative to programmable logic regions or other functional logic). It may be desirable to reduce the number of interconnects that are formed on device 10, thereby saving area on device 10 (e.g., area that can potentially be used for additional logic circuits to implement custom user designs). The number of interconnects that are required to route data throughout programmable integrated circuit 10 may be reduced by sharing interconnect resources between multiple programmable logic regions. FIG. 2 is a diagram of an illustrative interconnect bus 40 that may be shared by multiple programmable logic regions 18. If desired, interconnect bus 40 may be formed as part of interconnects 16 of FIG. 1 (e.g., some of interconnects 16 may be used to form interconnect bus 40).

Each programmable logic region 18 may produce output signals that are provided to a corresponding multiplexer 42 (e.g., multiplexers 42A-42G). Multiplexers 42 may form a cascade structure 44, with multiplexer 42A selecting between the output signals of the first two programmable logic regions 18 (e.g., between routing paths WA and WB) and with each successive multiplexer selecting between the output signal of a previous multiplexer and the output signal of a corresponding programmable logic region 18. For example, multiplexer 42B may provide an output signal selected from the output signal of multiplexer 42A and the output signal on routing path WC and provide the selected output signal to multiplexer 42C, etc.

Multiplexers 42 may be coupled to control circuitry 46 via paths 48. Control circuitry 46 and multiplexers 42 may be formed as part of input-output circuitry 21 of FIG. 1A (as an example). If desired, control circuitry 46 may be distributed throughout input-output circuits 21 (e.g., portions 50 may be provided to respective input-output circuits 21). Control circuitry 46 may provide dynamic control signals in real time (e.g., during normal operation of device 10) to the multiplexers via paths 48. For example, the control signals may be modified by control circuitry 46 during normal operation of programmable logic regions 18 and multiplexers 42. The dynamic control signals may control which data signals are provided to interconnect bus 40. For example, control circuitry 46 may provide control signals to multiplexers 42 that direct the multiplexers to select a programmable logic region output signal on routing path WD and provide the selected signals to interconnect 40. Optionally, portions 50 may be formed as decoders (e.g., decoding circuits) that receive control signals from sources such as programmable logic regions 18 or input-output circuitry 12 via path 52. Path 52 may be formed by appropriately configuring interconnects 16 to route control signals from programmable logic region 18 or input-output circuitry 12 to portions 50. Each decoder may control a respective multiplexer 42A, 42B, 42C, etc. based on the received control signals.

The example of FIG. 2 in which interconnect bus 40 receives data signals from programmable logic regions 18 is merely illustrative. If desired, interconnect bus 40 may receive data from any desired combination of programmable logic regions 18 and input-output circuitry such as input-output circuitry 12 via paths WA, WB, WC, etc.

The example of FIG. 2 in which multiplexers 42 (e.g., multiplexers 42A, 42B, 42C, etc.) are shown as having two inputs coupled to respective programmable logic regions 18 is merely illustrative. If desired, multiplexers 42 may have any desired number of inputs (e.g., two, three, four, or more) coupled to respective programmable logic regions 18 and may be controlled to route signals from a selected one of the programmable logic regions to interconnect bus 40.

Multiplexers 42 and control circuitry 46 may be formed as dedicated circuitry (sometimes referred to as hardened logic) or, if desired, may be formed by configuring programmable logic regions on device 10 to perform multiplexing and control functions (e.g., by loading appropriate configuration data into memory elements that are associated with the programmable logic regions). For example, each programmable logic region 18 may have an associated dedicated multiplexer 42 and decoder 50. As another example, some of programmable logic regions 18 may be configured to form multiplexers 42 and control circuitry 46. In this scenario, interconnects 16 between the programmable logic regions 18 may be configured to form paths WA, WB, WC, etc.

Figure 2A:
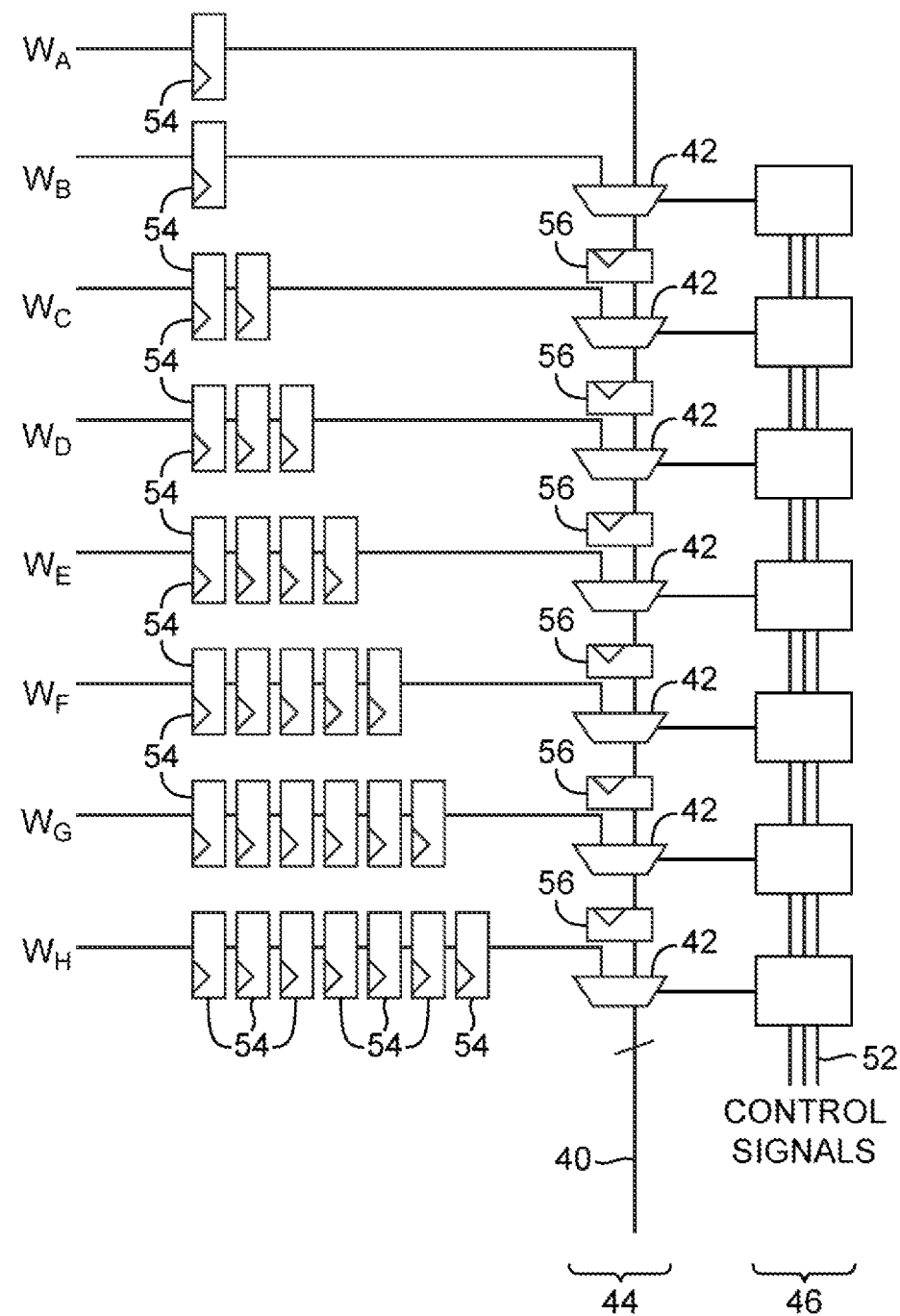
FIG. 2A is an illustrative diagram of a shared interconnect bus having interconnect circuitry with pipelining capabilities in accordance with an embodiment of the present invention.

If desired, data signals (e.g., output signals from programmable logic regions 18) may be pipelined using a shared interconnect bus. FIG. 2A shows how cascade structure 44 may be used to pipeline signals from routing paths WA-WH onto shared interconnect bus 40. As shown in FIG. 2A, cascade structure 44 may have associated registers 54 and 56. Registers 56 may be interposed between each multiplexer 42 and a subsequent multiplexer 42. Registers 54 may be provided to each routing path so that data signals provided on the routing paths traverse an equal number of registers before reaching interconnect bus 40. For example, signals on routing path WB may traverse one register 54 and six registers 56, whereas signals on routing path WH may traverse seven registers 54. In the example of FIG. 2A, data signals on a given routing path traverse seven registers before reaching shared interconnect bus 40.

The speed at which data may be transmitted via shared interconnect bus 40 may be constrained by the maximum delay between registers such as registers 54 and 56. For example, system clock frequencies that are associated with interconnect bus 40 may be limited by the maximum delay between registers. By providing shared interconnect bus 40 with associated registers 54 and 56, signal delay between any two registers may be reduced, thereby improving interconnect bus data rates (e.g., increasing clock frequencies of the registers). As an example, data signals on routing path WA may be delayed by the time required to traverse seven multiplexers 42. In this scenario, the signal delay associated with the seven multiplexers 42 may be partitioned between seven registers 54 and 56 so that the maximum signal delay between any two registers is substantially equal to the signal delay of a single multiplexer 42.

Figure 2B:
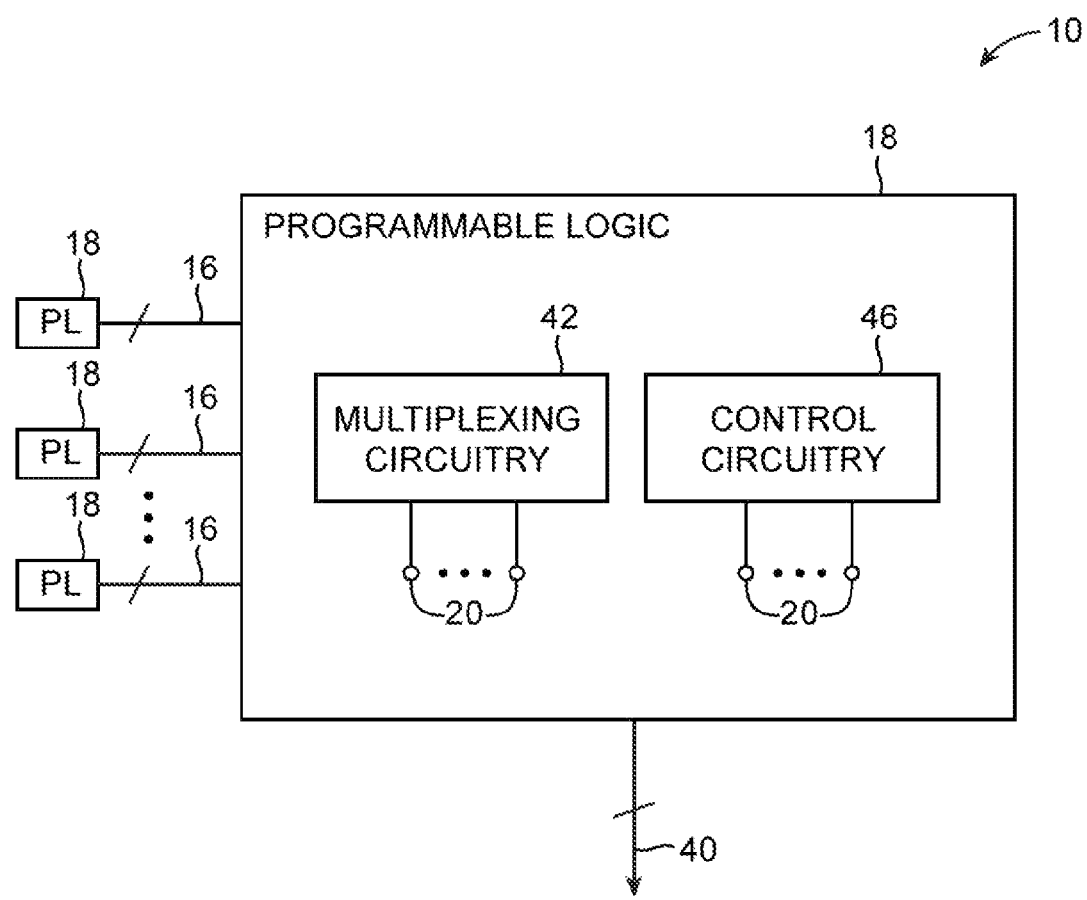
FIG. 2B is an illustrative diagram of interconnect circuitry for sharing an interconnect bus in accordance with an embodiment of the present invention.

FIG. 2B is a diagram of interconnect circuitry for sharing an interconnect bus formed by configuring programmable logic. As shown in FIG. 2B, portions of programmable logic region 18 may be configured to form multiplexing circuitry 42 and control circuitry 46. Programmable elements (e.g., memory elements that produce static output signals) 20 may be loaded with configuration bits that configure portions of programmable logic 18 to form multiplexing circuitry 42 and control circuitry 46 that receive data signals from other programmable logic regions 18 via interconnects 16 and provide a selected one of the data signals to shared interconnect bus 40.

Figure 3:
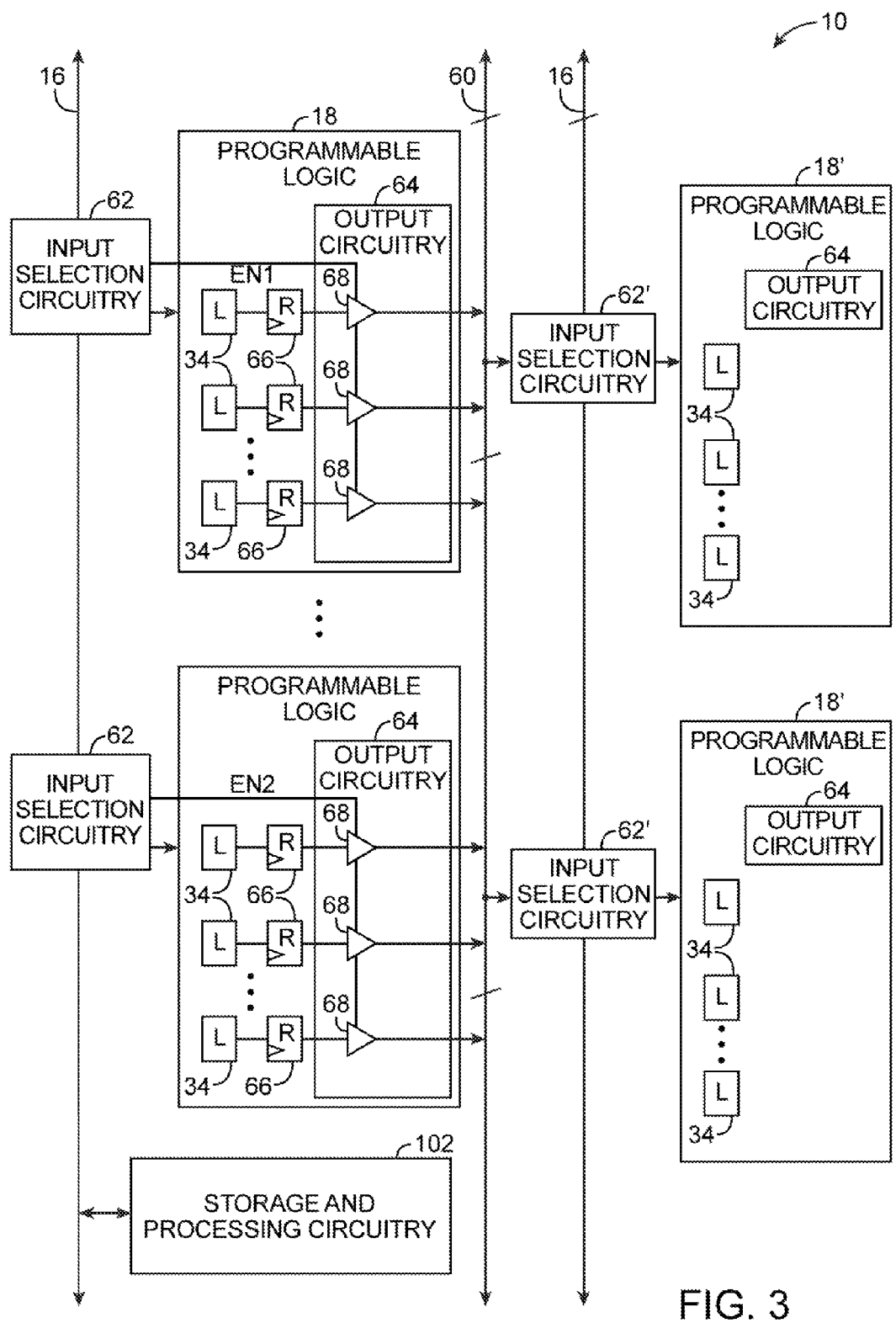
FIG. 3 is an illustrative diagram of programmable logic regions having output circuitry that may be used to share an interconnect bus in accordance with an embodiment of the present invention.

An interconnect bus may be shared by selectively enabling and disabling outputs of programmable logic regions that are coupled to the interconnect bus. FIG. 3 shows an illustrative device 10 in which programmable logic regions 18 are provided with output circuitry 64 that can be controlled to select which programmable logic region 18 is allowed to drive output signals onto shared interconnect bus 60.

As shown in FIG. 3, output circuitry 64 may include tristate drivers 68 that dynamically receive enable signals (e.g., enable signals EN1 and EN2). Each programmable logic region 18 may receive a corresponding enable signal that simultaneously controls tristate drivers 68 of that programmable logic region. The enable signals may be provided by storage and processing circuitry 102 via interconnects 16 and input selection circuitry 62. Storage and processing circuitry 102 may, if desired, be formed from programmable logic regions 18 or formed as dedicated circuitry. Tristate drivers that are enabled may drive corresponding interconnects of shared interconnect bus 60. For example, interconnect bus 60 may include multiple interconnects that are each coupled to each programmable logic region 18 via respective tristate drivers. Each tristate driver may receive an output signal provided by a respective logic region 34 (e.g., an output signal stored in a corresponding register 66). The enable signals may be provided to output circuitry 64 via interconnects 16 that are coupled to input selection circuitry 62. For example, input selection circuitry 62 may be configured to select which interconnect of interconnects 16 provides an enable signal (e.g., enable signals EN1 or EN2) to output circuitry 64.

The example of FIG. 3 in which tristate drivers 68 receive output signals from logic regions 34 via registers 66 is merely illustrative. If desired, tristate drivers 68 may receive output signals directly from logic regions 34 (e.g., bypassing registers 66). If desired, registers 66 may be formed as part of logic regions 34.

Tristate drivers 68 of each programmable logic region 18 may be simultaneously enabled or disabled by a corresponding enable signal. For example, tristate drivers 68 of a first programmable logic region 18 may be controlled in parallel by a first enable signal EN1 whereas tristate drivers 68 of a second programmable logic region 18 may be controlled in parallel by a second enable signal EN2. By providing appropriate enable signals to programmable logic regions 18 that are coupled to shared interconnect bus 60, the programmable logic regions 18 may be configured to share the use of interconnect bus 60 (e.g., interconnect bus 60 may be used to route data signals from multiple programmable logic regions 18 throughout device 10). For example, shared interconnect bus 60 may be used to route data signals to other programmable logic regions 18 via input selection circuitry 62.

Figure 4:
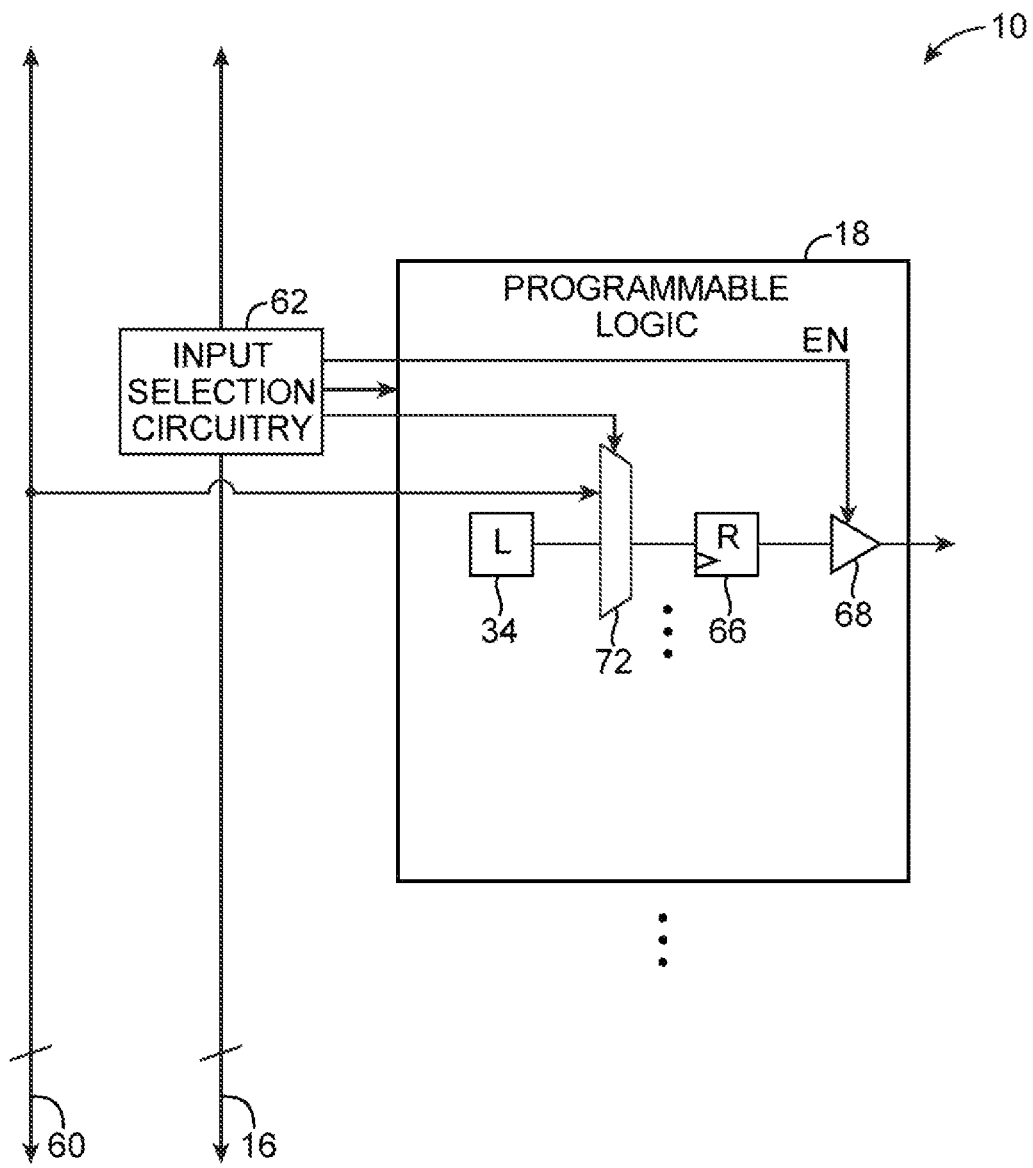
FIG. 4 is an illustrative diagram of a programmable logic region with logic sub-region bypass circuitry in accordance with an embodiment of the present invention.

If desired, an interconnect bus 60 that is shared by a set of programmable logic regions 18 may be used to provide data signals directly to other programmable logic regions (e.g., programmable logic regions 18') by bypassing input selection circuitry such as input selection circuitry 62'. The operation of programmable logic regions 18' may be substantially similar to programmable logic regions 18. The operation of input selection circuitry 62' may be substantially similar to the operation of input selection circuitry 62. FIG. 4 shows an illustrative scenario in which a programmable logic region 18 may be provided with multiplexing circuit 72 that provides the programmable logic region 18 with the capability of routing signals from interconnect bus 60 to a register 66. As shown in FIG. 4, multiplexing circuit 72 may receive data signals from interconnect bus 60 and programmable logic region 34 and provided a selected one of the data signals to register 66 for storage.

Figure 5:
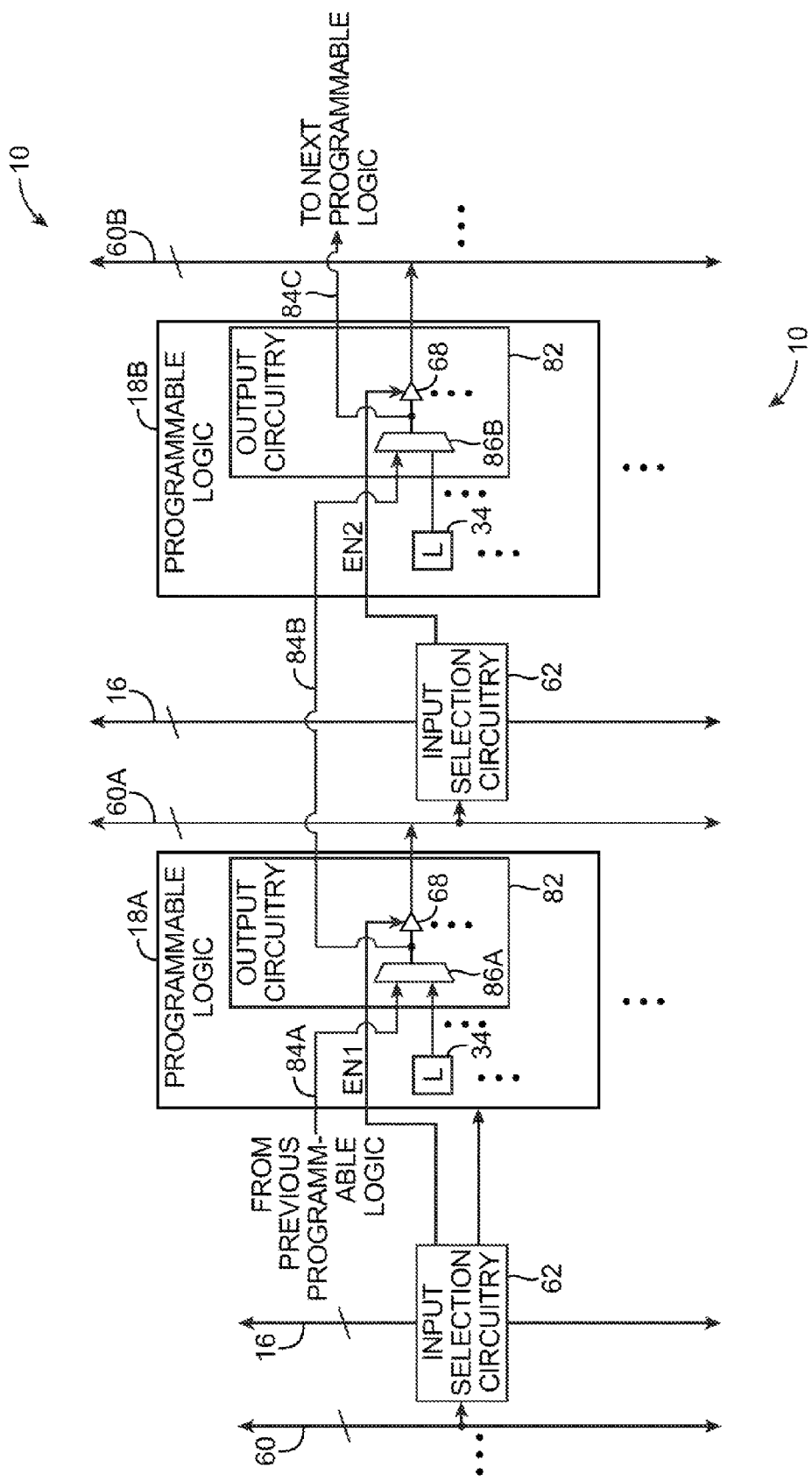
FIG. 5 is an illustrative diagram of programmable logic regions having output circuitry with interconnect bypass capability in accordance with an embodiment of the present invention.

In some scenarios, the number of data signals that are simultaneously used when performing custom user functions may exceed the number of available interconnects in a shared interconnect bus. For example, it may be desirable to simultaneously process data signals provided by first and second programmable logic regions 18 that are coupled to a shared interconnect bus 60. In this scenario, a given interconnect bus 60 may have an insufficient number of interconnects to accommodate the data signals provided by both the first and second programmable logic regions 18. To accommodate custom user functions that require simultaneous processing of many data signals (e.g., a number of data signals that exceed the number of available interconnects of a single shared interconnect bus), device 10 may be provided with output circuitry capable of routing programmable logic output signals to different interconnect buses. FIG. 5 is an illustrative diagram of programmable logic regions having output circuitry 82 that can be used to route data signals provided by a first programmable logic region 18A to a second programmable logic region 18B. By configuring output circuitry 82, data signals from programmable logic regions may be routed to different interconnect buses.

As shown in FIG. 5, output circuitry 82 may each include a multiplexing circuit 86 (e.g., multiplexing circuits 86A or 86B) that selects between signals provided from a previous programmable logic region and signals provided by a corresponding logic element 34. Multiplexing circuits 86 may be configured to route signals from a given programmable logic region 18 to a desired interconnect bus. For example, to route signals produced by logic region 34 of programmable logic 18A to interconnect bus 60B, multiplexing circuit 86A may be configured to route the signals from logic region 18 to path 84B and multiplexing circuitry 86B may be configured to route the signals from path 84B to tristate driver 68 of programmable logic 18B. In this scenario, enable signal EN1 may be de-asserted and enable signal EN2 may be asserted (e.g., to route the signals to interconnect bus 60B without routing the signals to interconnect bus 60A).

By providing programmable logic regions 18 with the capability of driving output signals onto different interconnect busses, device 10 may be able to accommodate custom user functions that process wide inputs (e.g., inputs with more parallel bits than available interconnects on a given interconnect bus 60). For example, data signals from multiple programmable logic regions 18 may be routed by multiple interconnect buses 60.

In some scenarios, enable signals that are provided to programmable logic regions 18 may be subject to different amounts of signal delay. For example, the programmable logic regions may be located at different distances from circuitry that provides the enable signals. In this scenario, the enable signals may travel different distances across interconnects and may be conveyed across interconnects having different physical properties (e.g., the interconnects may be formed on different metal processing layers). The enable signals may traverse transistors that each introduces variable amounts of delay. For example, enable signals may traverse different transistors within input selection circuitry 62. In this scenario, the transistors may introduce variable amounts of signal delay associated with process variations and/or other variations. The enable signals may therefore reach the programmable logic regions at different times and potentially enable tristate drivers of different programmable logic regions at the same time. In other words, variance in enable signal timing may cause multiple programmable logic regions to drive a shared interconnect bus at the same time.

Figure 6:
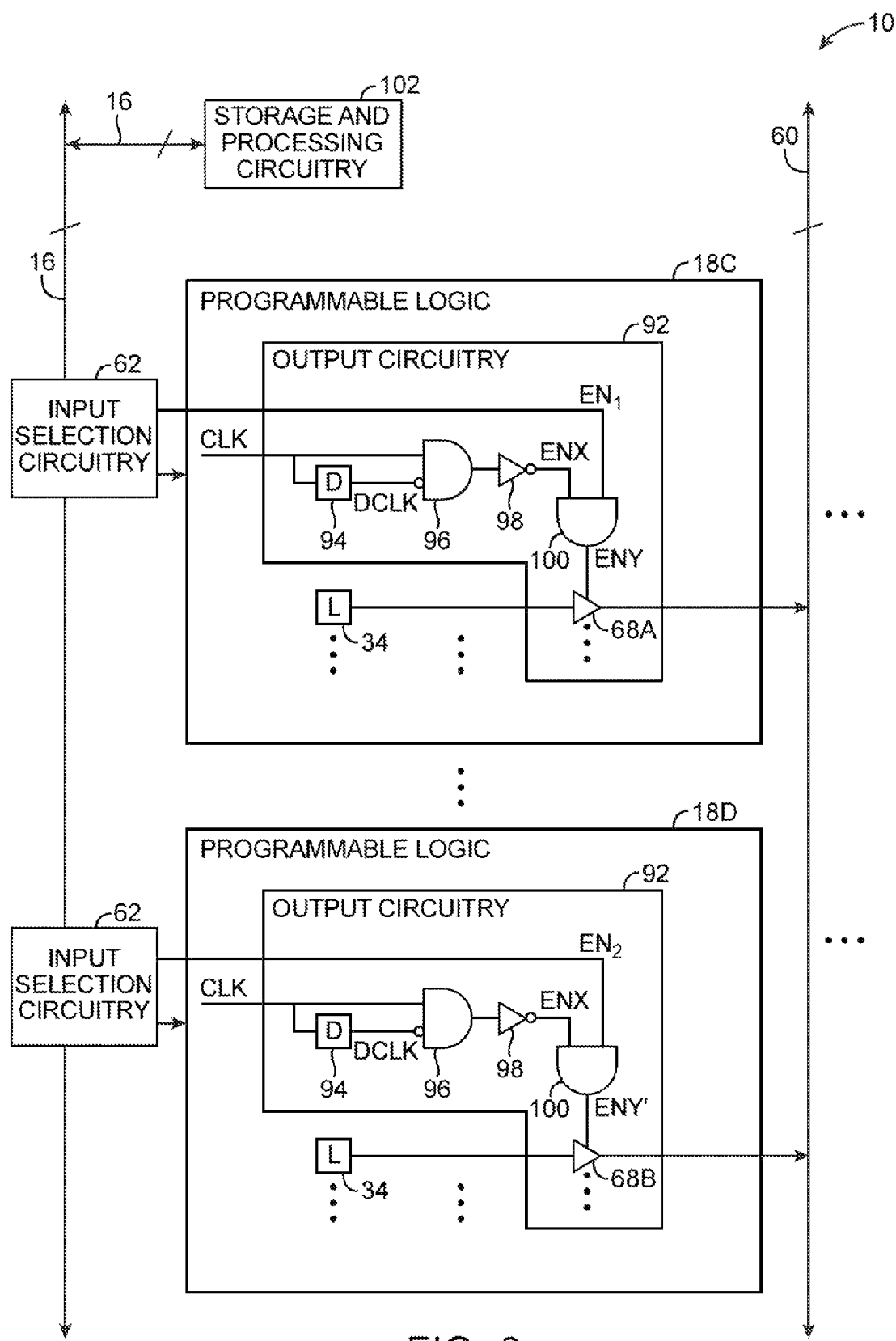
FIG. 6 is an illustrative diagram of a programmable integrated circuit with output circuitry that protects shared interconnect buses from being simultaneously driven by different programmable logic regions in accordance with an embodiment of the present invention.

It is generally desirable to prevent multiple programmable logic regions from driving the same interconnect bus, because the interconnect bus can potentially be driven by conflicting values (e.g., when a first programmable logic region drives positive power supply signals while a second programmable logic region drives ground power supply signals). FIG. 6 shows illustrative output circuitry 92 that may be provided to programmable logic regions 18 to protect shared interconnect buses from being simultaneously driven by different programmable logic regions by preventing different programmable logic regions 18 from simultaneously driving a given shared interconnect bus 60.

As shown in FIG. 6, output circuitry 92 may each receive a respective enable signal (e.g., enable signal EN1 or EN2) from input selection circuitry 62 and may receive clock signal CLK. Storage and processing circuitry 102 may provide enable signals EN1 and EN2 to programmable logic regions 18 via interconnects 16 and input selection circuitry 62. Enable signals EN1 and EN2 may be subject to uncertain amounts of signal delay. For example, power supply noise, thermal noise, process variations, and other sources of uncertainty may cause enable signals EN1 and EN2 to rise and fall at different times.

Output circuitry 92 may include delay element 94, logic AND gate 96, inverter 98, and logic AND gate 100. Delay element 94 may receive clock signal CLK and produce a delayed clock signal DCLK. Logic AND gate 96 may simultaneously receive clock signal CLK and an inverted version of delayed clock signal DCLK and may perform a logic AND function on the received signals. Inverter 98 may invert the output of AND gate 96 to produce enable signal ENX. Each AND gate 100 may receive a corresponding enable signal (e.g., enable signal EN1 or EN2) and signal ENX and may produce a tristate enable signal (e.g., signal ENY or ENY') to a corresponding tristate driver (e.g., tristate driver 68A or 68B).

Figure 7:
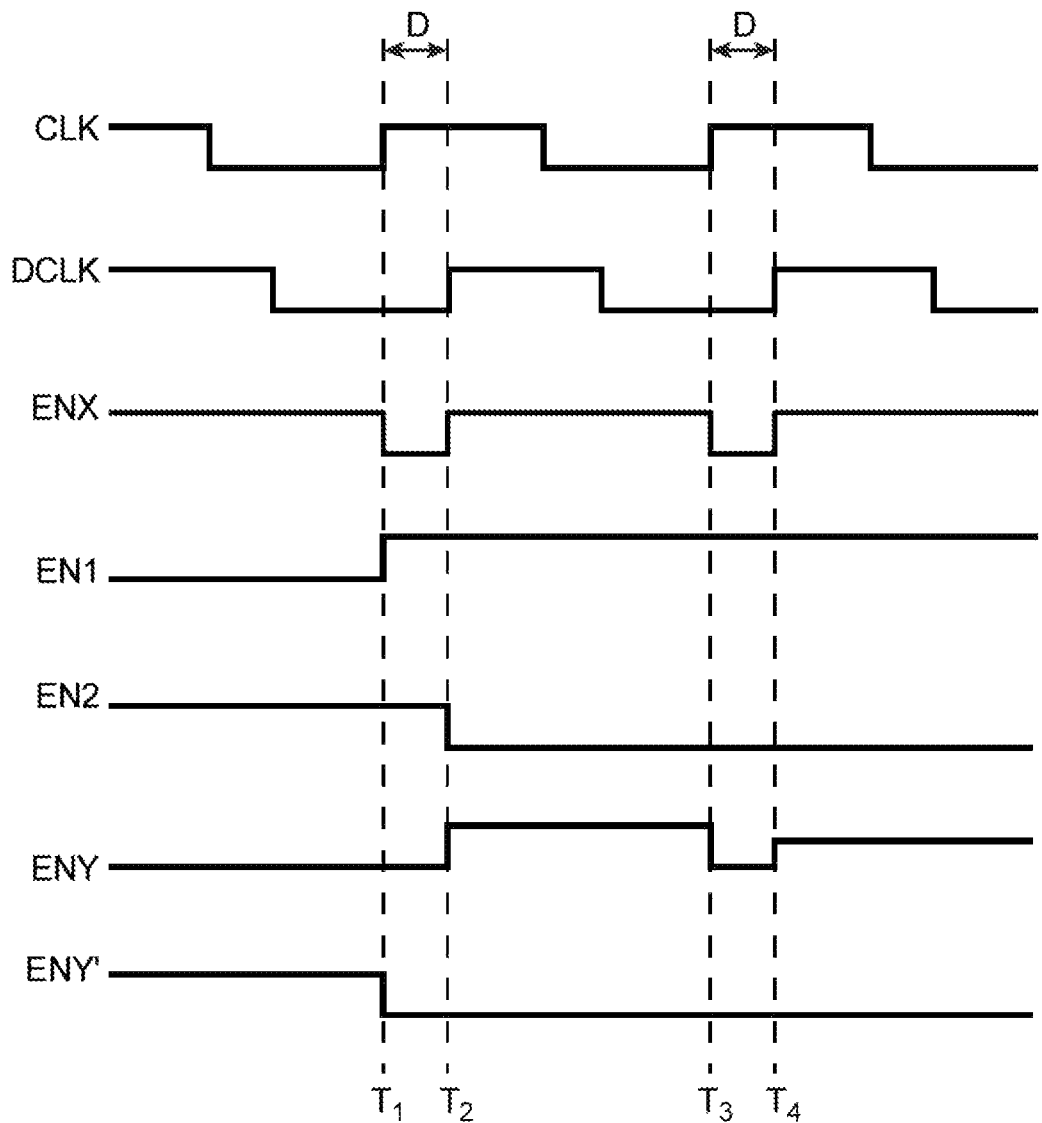
FIG. 7 is an illustrative timing diagram of output circuitry preventing a shared interconnect bus from being simultaneously driven by programmable logic regions in accordance with an embodiment of the present invention.

By generating enable signal ENX based on clock signal CLK and delayed clock signal DCLK, output circuitry 92 may help protect shared interconnect bus 60 from simultaneous driving by tristate drivers 68A and 68B. FIG. 7 is an illustrative timing diagram of output circuitry 92 preventing a shared interconnect bus 60 from being simultaneously driven by programmable logic regions.

As shown in FIG. 7, enable signal ENX may have a logic zero value (e.g., zero volts or a power supply ground voltage) when both periodic clock signal CLK is high and delayed clock signal DCLK is low (e.g., between times T1-T2 and T3-T4). At other times, enable signal ENX may have a logic high value (e.g., a positive power supply voltage). In other words, enable signal ENX may be de-asserted at each rising edge of clock signal CLK for a period of time approximately equal to the delay that is associated with delay element 94.

Enable signals EN1 and EN2 may be subject to uncertainty associated with the operation of circuitry that generates enable signals EN1 and EN2 and/or the transmission of the enable signals along routing paths (e.g., transmission through interconnects 16). In the scenario of FIG. 7, enable signal EN1 may be asserted and enable signal EN2 may be de-asserted. In other words, enable signals EN1 and EN2 may initially be provided so that programmable logic 18D drives shared interconnect 60 (e.g., tristate driver 68B is enabled and tristate driver 68A is disabled). At time T1, the initial state of device 10 may transition to a state in which tristate driver 68A is enabled and tristate driver 68B is disabled. Enable signal EN1 may be asserted at time T1 to enable tristate driver 68A. However, de-assertion of signal EN2 may be delayed until time T2 (e.g., due to uncertainty associated with signal generation and routing, enable signal EN2 may be delayed relative to enable signal EN1 and may be received by programmable logic 18A at time T2). During times between T1 and T2, programmable logic regions 18C and 18D may each receive asserted enable signals (e.g., EN1 and EN2 may both be asserted).

Enable signal ENY may be asserted when both EN1 and ENX are asserted, whereas enable signal ENY' may be asserted when both EN2 and ENX are asserted. Signal ENX may control enable signals ENY and ENY' so that tristate drivers 68A and 68B are both disabled for time D after each rising edge of clock signal CLK (e.g., because signal ENX may force signal ENY to a logic low value during times T1-T2 and T3-T4). By disabling tristate drivers 68A and 68B during times T1-T2 and T3-T4, output circuitry 92 may help prevent simultaneous driving of shared interconnect bus 60.

Figure 8:
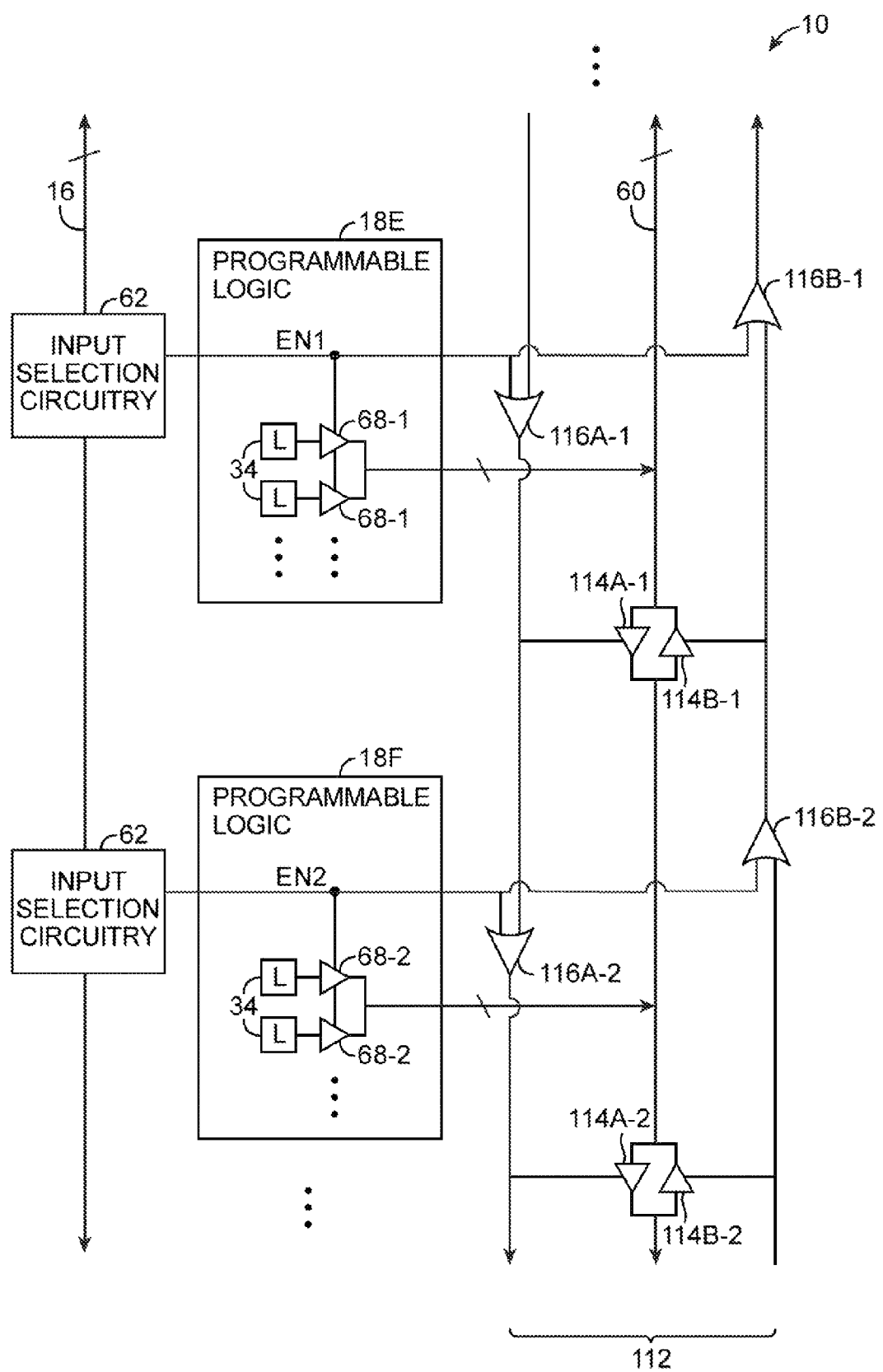
FIG. 8 is an illustrative diagram of a programmable integrated circuit with bi-directional interconnect driver circuitry in accordance with an embodiment of the present invention.

A shared interconnect bus such as interconnect bus 60 may have associated driver circuitry that helps propagate data signals (e.g., output signals from programmable logic regions 18) along the shared interconnect bus. FIG. 8 is an illustrative diagram showing how shared interconnect bus 60 may be provided with circuitry 112 for propagating output signals from programmable logic regions 18 (e.g., regions 18E and 18F) along shared interconnect bus 60.

Circuitry 112 may include tristate drivers 114A-1 and 114A-2 that receive respective control signals from logic OR gates 116A-1 and 116A-2. Circuitry 112 may include tristate drivers 114B-1 and 114B-2 that receive respective control signals from logic OR gates. For example, tristate driver 114B-1 receives a control signal produced by logic OR gate 116B-2. In the example of FIG. 8, the logic OR gate that provides a control signal to tristate driver 114B-2 is not shown. Logic OR gates 116A (e.g., logic OR gates 116A-1 and 116A-2) may be formed in the same direction along interconnect bus 60 as tristate drivers 114A (e.g., down) whereas logic OR gates 116B may be formed in the same direction as tristate drivers 114B (e.g., up). Circuitry 112 may sometimes be referred to as bi-directional driving circuitry, because tristate drivers 114A and 114B drive signals along interconnect bus 60 in two different directions.

Logic OR gates 116B (e.g., logic OR gates 116B-1 and 116B-2) may be formed in a cascade structure, with each logic OR gate 116B receiving the output of a previous logic OR gate 116B along with the enable signal associated with a corresponding programmable logic region 18. For example, logic OR gate 116B-1 may receive the output of logic OR gate 116B-2 along with enable signal EN1 that is associated with programmable logic region 18E. The output of each logic OR gate 116B may be coupled to and control a respective tristate driver 114B (e.g., logic OR gate 116B-2 may control tristate driver 114B-1). Logic OR gates 116A may be formed in a cascade structure in an opposite direction along shared interconnect bus 60 and may provide control signals to tristate drivers 114A. By forming logic OR gates 116A and 116B in cascade structures, a selected output signal of programmable logic regions 18 may be propagated in opposite directions along shared interconnect bus 60.

As an example, consider the scenario in which enable signal EN2 is provided to programmable logic region 18F. Enable signal EN2 may enable tristate drivers 68-2 to drive interconnect bus 60 with output signals from programmable logic region 18F. In this scenario, logic OR gate 116A-2 may receive enable signal EN2 and enable tristate driver 114A-2 so that the output signals from programmable logic region 18F are propagated in a first direction (e.g., down). Logic OR gate 116B-2 may receive enable signal EN2 and enable tristate driver 114B-1 so that the output signals from programmable logic region 18F are propagated in a second direction (e.g., up). Logic OR gate 116B-1 may receive enable signal EN2 via logic OR gate 116B-2 and forward enable signal EN2 to other tristate drivers 114B and logic OR gates 116B so that the output signals from programmable logic region 18F are further propagated along shared interconnect bus 60. By providing circuitry 112 with cascade structures that control tristate drivers 114A and 114B in opposite directions along shared interconnect bus 60, selected signals from programmable logic regions 18 may be propagated throughout device 10 (e.g., to other programmable logic regions 18).

The example of FIG. 8 in which logic OR gates 116A and 116B are described as propagating signals "up" or "down" interconnect bus 60 is merely illustrative. If desired, interconnect bus 60 may be formed along any axis of device 10 and logic OR gates 116A and 116B may be formed in opposite directions along the axis of interconnect bus 60.

Figure 9:
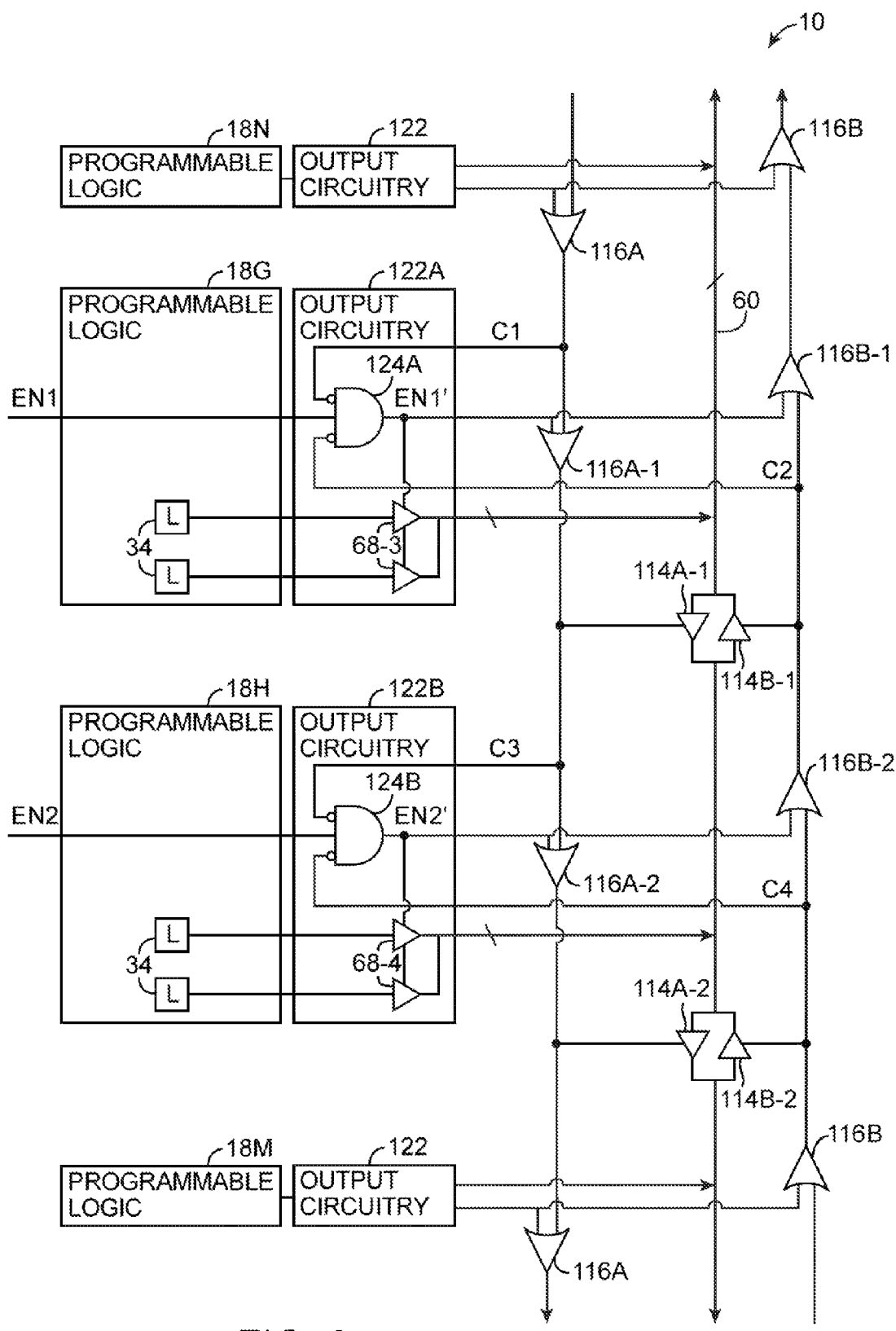
FIG. 9 is an illustrative diagram of a programmable integrated circuit with bi-directional interconnect driver circuitry and output circuitry that protects a shared interconnect bus from being simultaneously driven by different programmable logic regions in accordance with an embodiment of the present invention.

It may be desirable to form device 10 with programmable logic output circuitry that helps protect a shared interconnect bus throughout normal operation of the device. FIG. 9 shows an illustrative embodiment in which device 10 may be formed with output circuitry 122 (e.g., output circuitry 122A and 122B) having shared interconnect bus protection capabilities. Output circuitry 122 may each be associated with a respective programmable logic region 18. As shown in FIG. 9, device 10 may include circuitry 112 having tristate drivers 114A and 114B and logic OR gates 116A and 116B that propagate signals along shared interconnect bus 60. Tristate drivers 114A and logic OR gates 116A may propagate signals in a first direction (e.g., down) while tristate drivers 114B and logic OR gates 116B may propagate signals in a second direction opposite to the first (e.g., up).

Programmable logic regions such as regions 18G and 18H may be associated with output circuitry 122A and 122B, respectively. Output circuitry 122 may include logic AND gates 124A and 124B that help protect shared interconnect bus 60 from being simultaneously driven with output signals from different programmable logic regions 18. Logic AND gate 124A may receive inverted versions of control signals C1 and C2 along with the enable signal associated with programmable logic 18G. Control signal C1 may represent whether any enable signals above enable signal EN1 are asserted (e.g., enable signals associated with programmable logic regions such as programmable logic region 18N that are located above programmable logic region 18G). Control signal C2 may represent whether any enable signals below enable signal EN1 are asserted. For example, programmable logic region 18H may be located below programmable logic region 18G relative to interconnect bus 60 and control signal C2 may therefore represent whether enable signal EN2 is asserted. As another example, control signal C4 may represent whether any enable signal below enable signal EN2 are asserted (e.g., enable signals associated with programmable logic regions such as programmable logic region 18M that are located below programmable logic region 18H). If control signals C1 and C2 are both de-asserted (e.g., when the inverted versions of control signals C1 and C2 have logic high values), AND gate 124A may provide enable signal EN1 to drivers 68-3 and logic OR gates 116A-1 and 116B-1 so that the output signals of programmable logic region 18G are propagated along shared interconnect bus 60 when enable signal EN1 is asserted. In other words, enable signal EN1' produced by AND gate 124A may be true when enable signal EN1 is true, control signal C1 is false, and control signal C2 is false.

Logic AND gate 124B may receive control signals C3 and C4 and propagate enable signal EN2 as signal EN2' when programmable logic region 18H is the only programmable logic region that is enabled (e.g., when C3 is false and C4 is false).

Figure 10:
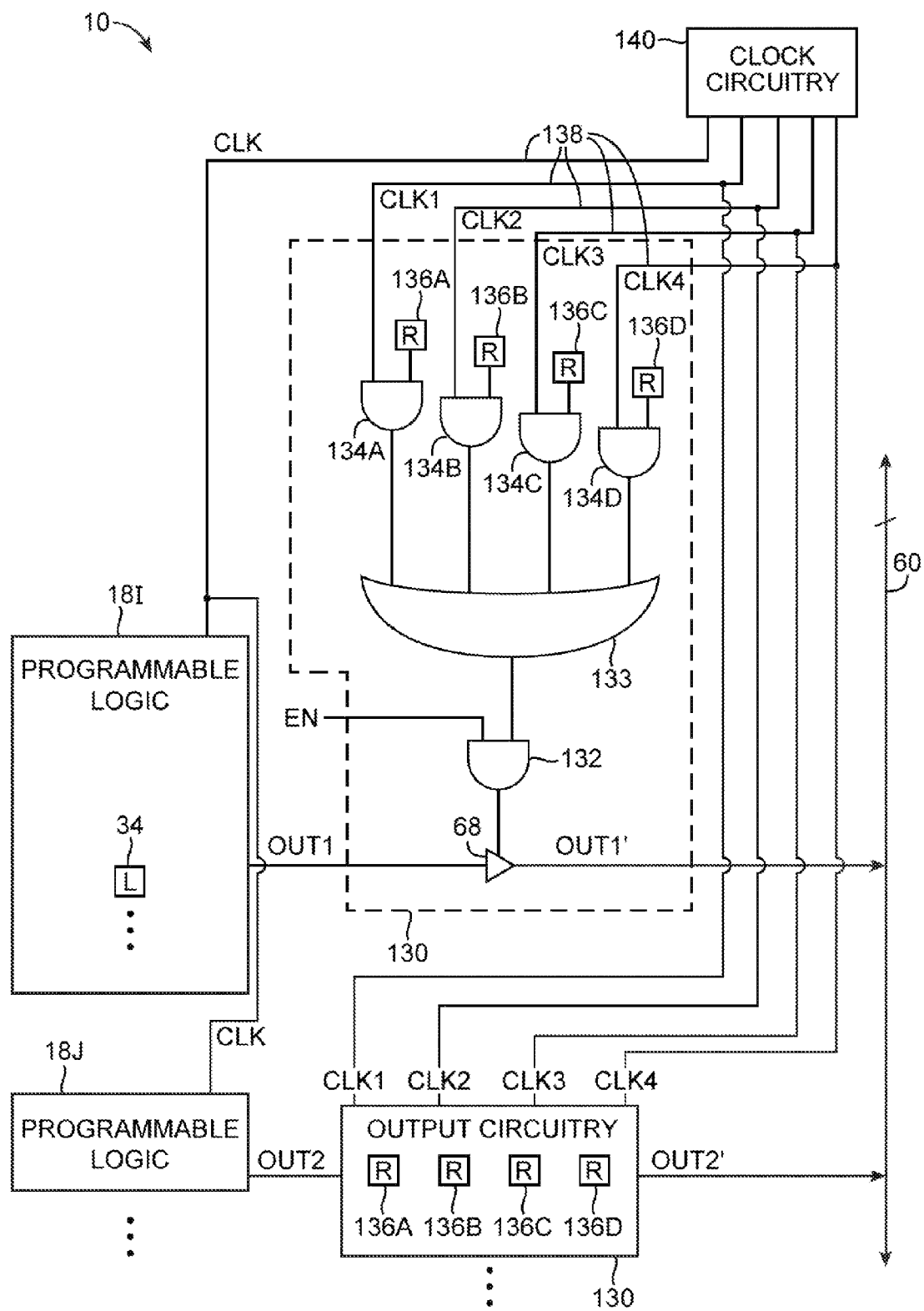
FIG. 10 is an illustrative diagram of output circuitry that may be used for time division multiplexing of a shared interconnect bus in accordance with an embodiment of the present invention.

If desired, programmable logic regions may be provided with output circuitry that partitions use of a shared interconnect bus in time (sometimes referred to as time division multiplexing). FIG. 10 shows illustrative output circuitry 130 with time division multiplexing capabilities that may be provided to each programmable logic region 18 of device 10.

As shown in FIG. 10, output circuitry 130 may include logic AND gate 132 that receives enable signal EN and the output of logic OR gate 133. Logic AND gates 134 may be controlled by respective memory elements (e.g., programmable registers) 136 to pass a selected one of clock signals CLK1, CLK2, CLK3, and CLK4 to logic AND gate 132 via logic OR gate 133. For example, logic AND gates 134 may be controlled to provide clock signal CLK1 to logic AND gate 132 by loading memory element 136A with a logic high value and loading memory elements 136B, 136C, and 136D with logic low values. In this scenario, memory elements 136B, 136C, and 136D may prevent logic AND gates 134B, 134C, and 134D from passing clock signals CLK2, CLK3, and CLK4, whereas memory element 136A may allow logic AND gate 134A to pass clock signal CLK1 to logic AND gate 132 via logic OR gate 133.

Clock circuitry 140 may generate system clock signals CLK, CLK1, CLK2, CLK3, and CLK4 (e.g., using phase-locked loops, oscillators, or other clock generation circuitry). Clock signals CLK1, CLK2, CLK3, and CLK4 may be provided by clock circuitry 140 to logic AND gates 134 via clock distribution paths 138. Clock signal CLK may be provided by clock circuitry 140 to programmable logic regions 18I and 18J via path 138. Clock signal CLK may determine when output signals OUT1 and OUT2 are updated by programmable logic regions 18I and 18J. For example, registers in programmable logic region 18I that store output signal OUT1 may be updated with the rising edge of clock signal CLK.

Figure 11:
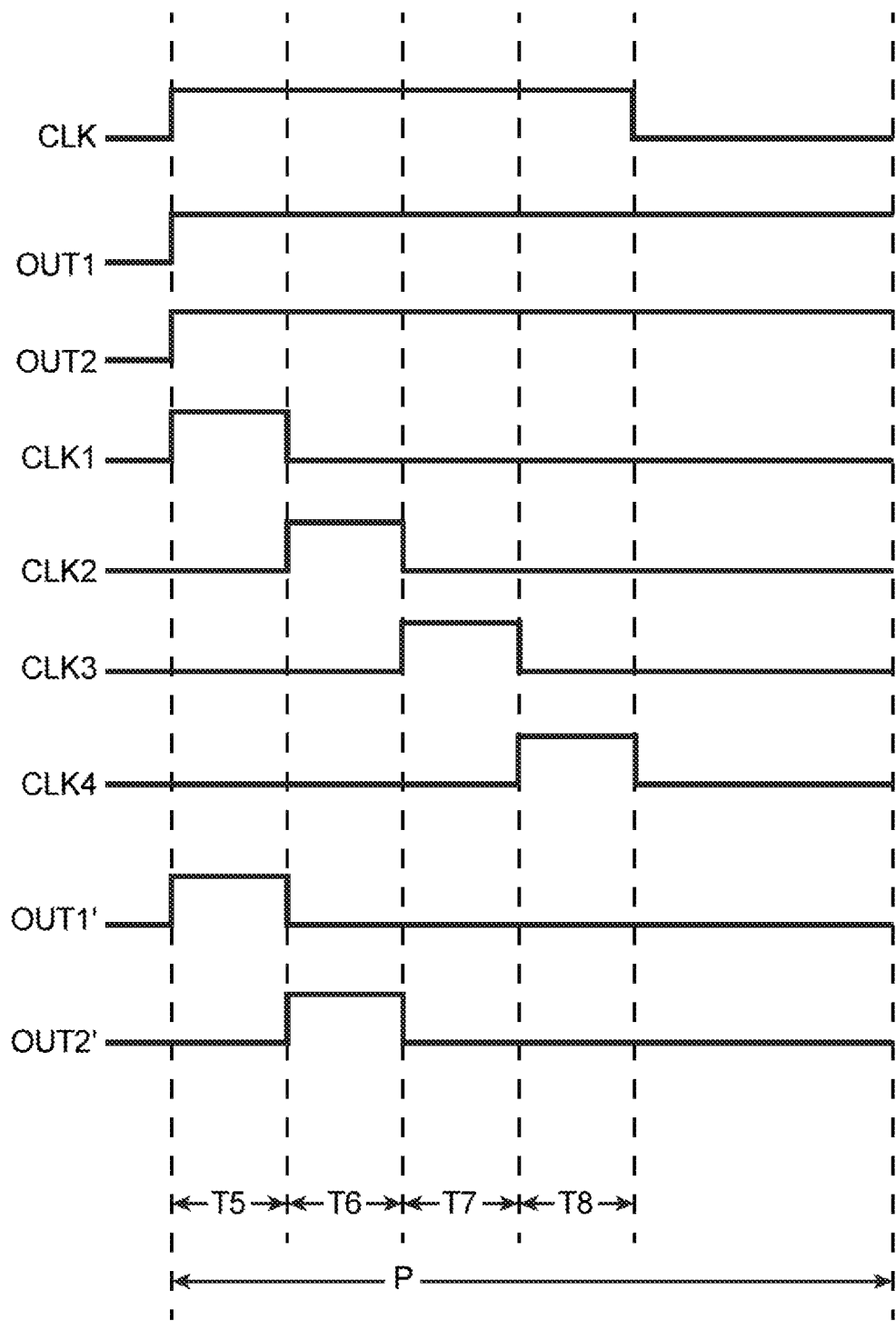
FIG. 11 is an illustrative timing diagram showing clock signals provided for time division multiplexing of a shared interconnect in accordance with an embodiment of the present invention.

Clock signals CLK1, CLK2, CLK3, and CLK4 may be generated by clock circuitry 140 so that programmable logic regions 18I and 18J are only allowed to drive shared interconnect bus 60 during a predetermined portion of each clock period of system clock signal CLK. By only allowing each programmable logic region 18 to drive shared interconnect bus 60 during a predetermined portion of each system clock period, output circuitry 130 may accommodate shared use of interconnect bus 60. FIG. 11 is an illustrative timing diagram that shows how output circuitry 130 may accommodate shared used of interconnect bus 60.

As shown in FIG. 11, system clock signal CLK may be a periodic clock signal with period P. Output signals OUT1 and OUT2 may be generated at the rising edge of clock signal CLK (e.g., generated by respective programmable logic regions 18I and 18J). Clock signals CLK1, CLK2, CLK3, and CLK4 may be asserted during respective time slots T5, T6, T7, and T8 of each clock period of clock signal CLK.

Each programmable logic region may be assigned a time slot by appropriately configuring associated output circuitry 130 (e.g., by loading associated memory elements 136A, 136B, 136C, and 136D with appropriate values that a desired clock signal to logic AND gate 132). In the example of FIG. 11, programmable logic regions 18I and 18J may be assigned respective time slots T5 and T6. By configuring output circuitry 130 to assign time slots T5 and T6 to programmable logic regions 18I and 18J, each programmable logic region may be allowed to drive shared interconnect bus 60 during the assigned time slot, thereby avoiding bus conflicts. For example, programmable logic region 18I may drive interconnect bus 60 with output signal OUT1' during time slot T5 and programmable logic region 18J may drive interconnect bus 60 with output signal OUT2' during time slot T6.

The example of FIGS. 10 and 11 in which programmable logic regions 18I and 18J are assigned time slots T5 and T5 is merely illustrative. If desired, any suitable number of programmable logic regions may be formed on device 10 and the programmable logic regions may be assigned any desired time slot of a system clock. If desired, a system clock period may be divided into any number of time slots (e.g., clock circuitry 140 may be used to generate clock signals associated with any number of time slots that can be assigned to programmable logic regions via output circuitry 130).

If desired, the time-division multiplexing arrangement of FIG. 10 may be combined with the pipelining scheme of FIG. 2. For example, each programmable logic region 18 of FIG. 2 may have associated output circuitry 130 that performs time divisional multiplexing and may have cascade structure 44 that performs pipelining. In this scenario, cascade structure 44 may reduce latencies between registers, thereby increasing timing slack in each system clock period. The increased timing slack may be divided by output circuitry 130 into an increased number of time slots. By increasing the number of time slots for each system clock period, data rates over shared interconnect bus 40 may be increased.

Figure 12:
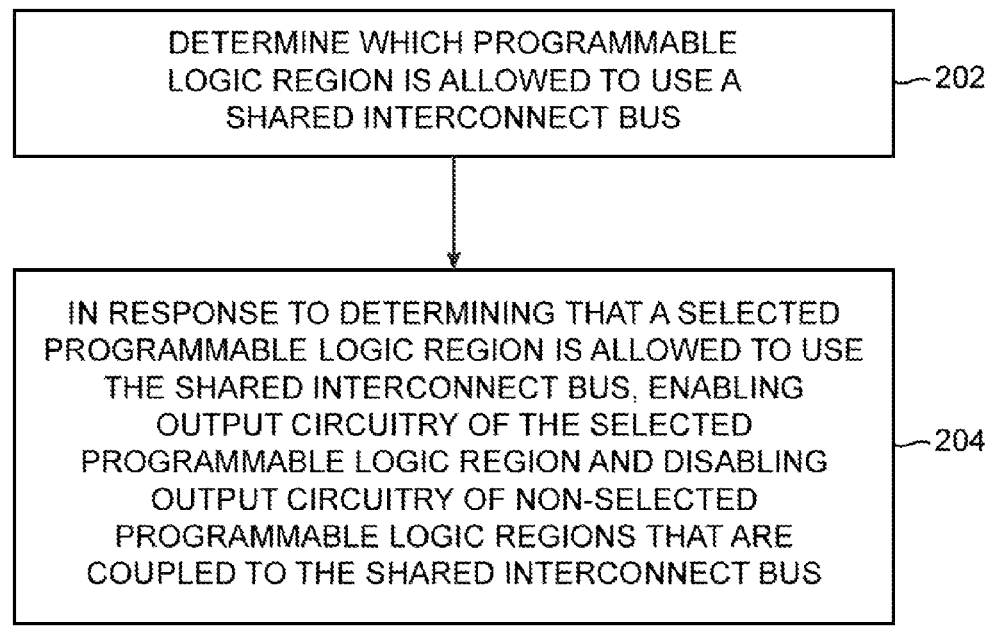
FIG. 12 is a flowchart of illustrative steps that may be performed to share an interconnect bus between programmable logic regions in accordance with an embodiment of the present invention.

Output circuitry such as output circuitry 64, 82, 92, 122, and 130 may be controlled by control circuitry such as storage and processing circuitry 102 of FIG. 6. The control circuitry may be formed from dedicated circuitry or formed from programmable logic regions that have been configured to perform control functions. The control circuitry may dynamically provide control signals to programmable logic regions that are coupled to a shared interconnect bus (e.g., the control circuitry may generate the control signals during normal operation of the device). The control signals may be provided to the programmable logic regions via routing paths such as interconnects 16. FIG. 12 is a flow chart of illustrative steps that may be performed by control circuitry to control shared used of an interconnect bus (e.g., interconnect bus 60).

In step 202, the control circuitry may determine which programmable logic region is allowed to use a shared interconnect bus. For example, the control circuitry may determine which programmable logic region is allowed to access the interconnect bus based on round robin or priority schemes.

In step 204, the control circuitry may provide control signals to the programmable logic regions in response to determining that a selected programmable logic region is allowed to access the interconnect bus. The control signals may enable output circuitry associated with the selected programmable logic region and disable output circuitry associated with non-selected programmable logic regions.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit comprising:
    an interconnect bus;
    a plurality of programmable logic regions operable to produce output signals;
    multiplexing circuitry operable to receive the output signals, wherein the multiplexing circuitry comprises a plurality of cascaded multiplexing circuits and wherein each successive cascaded multiplexing circuit of the plurality of cascaded multiplexing circuit selects between the output signal of a previous cascaded multiplexing circuit and the output signal of a corresponding programmable logic region of the plurality of programmable logic regions; and
    control circuitry operable to provide dynamic control signals in real time to the multiplexing circuitry, wherein the dynamic control signals direct the multiplexing circuitry to provide a selected output signal to the interconnect bus.

2. The integrated circuit defined in claim 1, wherein the cascaded multiplexing circuits comprise programmable logic regions operable to receive the dynamic control signals and provide the selected output signal to the interconnect bus.

3. The integrated circuit defined in claim 1, wherein the control circuitry comprises at least one programmable logic region operable to generate the dynamic control signals.

4. The integrated circuit defined in claim 1, wherein the control circuitry comprises at least one decoding circuit operable to generate the dynamic control signals based on signals received by the at least one decoding circuit.

5. The integrated circuit defined in claim 1, wherein the control circuitry is further operable to provide dynamic control signals that direct the multiplexing circuitry to provide a first selected output signal to the interconnect bus at a first time and further operable to provide dynamic control signals that direct the multiplexing circuitry to provide a second selected output signal to the interconnect bus at a second time.

6. An integrated circuit comprising:
    an interconnect bus;
    a plurality of programmable logic regions operable to produce output signals;
    multiplexing circuitry operable to receive the output signals, wherein the multiplexing circuitry comprises a plurality of cascaded multiplexing circuits;
    control circuitry operable to provide dynamic control signals in real time to the multiplexing circuitry, wherein the dynamic control signals direct the multiplexing circuitry to provide a selected output signal to the interconnect bus; and
    registers interposed between each cascaded multiplexing circuit of the plurality of cascaded multiplexing circuits.

7. The integrated circuit defined in claim 6 further comprising a plurality of registers interposed between the plurality of programmable logic regions and the interconnect bus, wherein output signals of each programmable logic region of the plurality of programmable logic regions is separated from the interconnect bus by a predetermined number of registers.

8. An integrated circuit comprising:
    an interconnect bus comprising a plurality of interconnects;
    a plurality of programmable logic regions; and
    a plurality of output circuits coupled to the interconnect bus that receive control signals, wherein each programmable logic region of the plurality of programmable logic regions is associated with a respective output circuit of the plurality of output circuits, and wherein each output circuit is operable to dynamically receive a respective control signal of the control signals in real time, wherein the respective control signal selectively enables and selectively disables that output circuit.

9. The integrated circuit defined in claim 8, wherein each output circuit comprises a tristate driver that is selectively enabled and disabled by the respective control signal.

10. The integrated circuit defined in claim 9 further comprising an additional programmable logic region, wherein the additional programmable logic region comprises:
    at least one programmable logic sub-region operable to produce output signals; and
    multiplexing circuitry operable to receive signals from the interconnect bus and further operable to receive the output signals, wherein said multiplexing circuitry is further operable to select between the output signals and the signals from the interconnect bus.

11. The integrated circuit defined in claim 9, wherein each output circuit of the plurality of output circuits comprises circuitry operable to receive the respective control signal and a clock signal having periodic clock cycles, wherein the circuitry is further operable to disable the tristate driver for a portion of each periodic clock cycle.

12. The integrated circuit defined in claim 11, wherein each output circuit of the plurality of output circuits comprises a delay element operable to generate a delayed clock signal from the clock signal, and wherein the portion of each periodic clock cycle comprises an overlap between the delayed clock signal and the clock signal.

13. The integrated circuit defined in claim 9, wherein each output circuit of said plurality of output circuits further comprises time divisional multiplexing circuitry operable to receive a plurality of clock signals and selectively enable the tristate driver of that output circuit based on a selected clock signal of the plurality of clock signals.

14. The integrated circuit defined in claim 9 further comprising control circuitry that generates the control signals in real time.

15. The integrated circuit defined in claim 8 wherein each programmable logic region of the plurality of programmable logic regions is coupled to a previous programmable logic region and a subsequent programmable logic region, and wherein each given programmable logic region comprises a multiplexing circuit operable to receive signals from a previous programmable logic region and signals from that given programmable logic region.

16. The integrated circuit defined in claim 8 further comprising:
   bi-directional driver circuitry operable to drive signals in first and second directions along the interconnect bus based at least partly on the control signals.

17. The integrated circuit defined in claim 16, wherein each output circuit of the plurality of output circuits further comprises logic circuitry that monitors the bi-directional driver circuitry, wherein said logic circuitry modifies the respective control signal to prevent the interconnect bus from being simultaneously driven by the plurality of output circuits.

18. A method of operating an integrated circuit having an interconnect bus, a plurality of programmable logic regions coupled to the interconnect bus, and a plurality of output circuits interposed between the programmable logic regions and the interconnect bus, wherein the plurality of output circuits comprises a plurality of tristate drivers that are coupled to the interconnect bus, the method comprising:
   with control circuitry, selecting a programmable logic region of the plurality of programmable logic regions allowed to drive output signals onto the interconnect bus, wherein the plurality of tristate drivers comprise a selected tristate driver that is associated with the selected programmable logic region and non-selected tristate drivers that are not associated with the selected programmable logic region; and
   in response to selecting the programmable logic region, providing dynamic control signals to the plurality of output circuits that direct the plurality of output circuits to drive output signals from the selected programmable logic region onto the interconnect bus, wherein providing the dynamic control signals to the plurality of output circuits comprises:
      with the control circuitry, enabling the selected tristate driver for driving the output signals from the selected programmable logic region onto the interconnect bus; and
      with the control circuitry, disabling the non-selected tristate drivers.

19. The method defined in claim 18, wherein the output circuits are coupled to form a cascade structure, and wherein providing dynamic control signals to the output circuits comprises providing dynamic control signals to the cascade structure.

* * * * *